United States Patent
Miyazono et al.

(10) Patent No.: US 8,471,585 B2
(45) Date of Patent: Jun. 25, 2013

(54) METHOD FOR EVALUATING SEMICONDUCTOR DEVICE

(75) Inventors: Mitsuyoshi Miyazono, Tokyo (JP); Shigekazu Komatsu, Nirasaki (JP); Dai Shinozaki, Nirasaki (JP); Masahiro Kato, Matsumoto (JP); Atsushi Yoshida, Matsumoto (JP)

(73) Assignees: Tokyo Electron Limited, Tokyo (JP); Fuji Electric Systems Co., Ltd., Tokyo (JP)

( * ) Notice: Subject to any disclaimer, the term of this patent is extended or adjusted under 35 U.S.C. 154(b) by 329 days.

(21) Appl. No.: 12/805,273

(22) Filed: Jul. 21, 2010

(65) Prior Publication Data

US 2011/0050269 A1 Mar. 3, 2011

(30) Foreign Application Priority Data

Aug. 27, 2009 (JP) .................. 2009-196182

(51) Int. Cl.
*G01R 31/26* (2006.01)
(52) U.S. Cl.
USPC .................................... 324/762.01
(58) Field of Classification Search
USPC ............. 324/762.01–762.1, 754.01–754.3, 324/755.01–755.1; 257/48; 438/14–18
See application file for complete search history.

(56) References Cited

U.S. PATENT DOCUMENTS

| | | | |
|---|---|---|---|
| 6,525,414 B2 * | 2/2003 | Shiraishi et al. | 257/686 |
| 6,727,723 B2 * | 4/2004 | Shimizu et al. | 324/750.05 |
| 2005/0003635 A1 | 1/2005 | Takekoshi | |
| 2010/0313667 A1 | 12/2010 | Terada et al. | |

FOREIGN PATENT DOCUMENTS

| | | |
|---|---|---|
| EP | 1484791 | 12/2004 |
| EP | 2206757 | 7/2010 |
| JP | 58-169921 | 10/1983 |
| JP | 04-065849 | 3/1992 |
| JP | 06-209042 | 7/1994 |
| JP | 07-283173 | 10/1995 |
| JP | 08-194012 | 7/1996 |
| JP | 11-148961 | 6/1999 |
| JP | 2000-074984 | 3/2000 |
| JP | 2000-074988 | 3/2000 |
| JP | 2002-25947 | 1/2002 |

(Continued)

OTHER PUBLICATIONS

Patent Abstracts of Japan, Publication No. 2003-258067, Published Sep. 12, 2003.

(Continued)

*Primary Examiner* — Tung X Nguyen
(74) *Attorney, Agent, or Firm* — Staas & Halsey LLP

(57) ABSTRACT

A yield and productivity of a semiconductor module are improved. A sheet having electrical conductivity is fixed to a main surface of a semiconductor substrate on which a plurality of semiconductor devices having a surface structure and a rear surface electrode are arranged. The semiconductor substrate is divided into semiconductor chips on a first support stage in the state where the sheet is fixed to its main surface. The plurality of divided semiconductor chips are mounted on a second support stage via the sheet and further, the plurality of mounted semiconductor chips are continuously subjected to a dynamic characteristic test on the second support stage. The proposed semiconductor device evaluation method permits a fissure growing and propagating from a crack occurring in the dynamic characteristic test of the vertical semiconductor devices to be suppressed, and the yield and productivity of the semiconductor module to be improved.

6 Claims, 6 Drawing Sheets

FOREIGN PATENT DOCUMENTS

| | | |
|---|---|---|
| JP | 2003-258067 | 9/2003 |
| JP | 2004-71887 | 3/2004 |
| JP | 2005-085970 | 3/2005 |
| JP | 2008-071916 | 3/2008 |
| JP | 2009-114394 | 5/2009 |
| WO | 2009/060686 | 5/2009 |

OTHER PUBLICATIONS

Patent Abstracts of Japan, Publication No. 08-194012, Published Jul. 30, 1996.
Patent Abstracts of Japan, Publication No. 2005-085970, Published Mar. 31, 2005.
Patent Abstracts of Japan, Publication No. 06-209042, Published Jul. 26, 1994.
Patent Abstracts of Japan, Publication No. 07-283173, Published Oct. 27, 1995.
Patent Abstracts of Japan, Publication No. 2004-71887, published Mar. 4, 2004.
Extended European Search Report issued Oct. 24, 2012 in corresponding European Patent Application No. 10172478.9.
Patent Abstracts of Japan Publication No. 11-148961, published Jun. 2, 1999.
Patent Abstracts of Japan Publication No. 04-065849, published Mar. 2, 1992.
Patent Abstracts of Japan Publication No. 2000-074984, published Mar. 14, 2000.
Espacenet Bibliographic data, Publication No. 2000-074988, published Mar. 14, 2000.
Patent Abstracts of Japan Publication No. 2008-071916, published Mar. 27, 2008.
Japanese Office Action issued Dec. 18, 2012 in corresponding Japanese Patent Application No. 2009-196182.
US2005/0003635 A1 and EP1484791 correspond to JP2003-258067, which was submitted in the IDS filed Jul. 21, 2010.
Patent Abstracts of Japan, Publication No. 58-169921, Published Oct. 6, 1983.
Patent Abstracts of Japan, Publication No. 2002-025947, Published Jan. 25, 2002.
Japanese Patent Office Action dated Apr. 9, 2013 in Japanese Patent Application No. 2009-196182.

* cited by examiner

METHOD FOR EVALUATING SEMICONDUCTOR DEVICE

CROSS-REFERENCE TO RELATED APPLICATIONS

This application is based upon and claims the benefit of priority of the prior Japanese Patent Application No. 2009-196182, filed on Aug. 27, 2009, the entire contents of which are incorporated herein by reference.

FIELD

The embodiments discussed herein are related to methods for evaluating a semiconductor device and, more particularly, to semiconductor device evaluation methods of a vertical semiconductor device.

BACKGROUND

On a semiconductor substrate that is subjected to a wafer processing, a plurality of semiconductor devices are arranged longitudinally and laterally. These semiconductor devices are divided by dicing and then, incorporated into a semiconductor module.

The above-described semiconductor devices are normally subjected, before being incorporated into the semiconductor module, to an electrical characteristic test for the semiconductor device. For example, FIG. 5 is a configuration view of an apparatus for performing the electrical characteristic test.

FIG. 5 illustrates a state of a static characteristic test for measuring a leakage current between electrodes on vertical semiconductor devices.

A prober (test apparatus) 100 includes a cantilever type probe pin 101, a probe card 102 for supporting the probe pin 101, and a prober stage 104 for supporting a semiconductor substrate 103 as an object to be inspected. Here, as described above, a plurality of vertical semiconductor devices (not illustrated) are arranged in every direction of the semiconductor substrate 103.

On each vertical semiconductor device, a surface structure and a rear surface electrode are formed. On the surface structure, a gate electrode and an emitter electrode are formed. Further, the rear surface electrode serves as a collector electrode, and is configured by a metal film.

When the prober stage 104 is raised, a plurality of probe pins 101 having needlepoints with different diameters contact electrodes on the surface structure, and the vertical semiconductor device with a contacted portion is subjected to the static characteristic test. Further, when a relative position between the probe pin 101 and the semiconductor substrate 103 is changed, the plurality of vertical semiconductor devices are continuously subjected to the static characteristic test on the same stage.

On the other hand, in the electrical characteristic test, a dynamic characteristic test as in a so-called high current switching test is performed in addition to the static characteristic test.

However, in the dynamic characteristic test, a high current of approximately 0 to several hundred amperes is energized within the vertical semiconductor device. Therefore, cracks with a diameter of approximately 100 μm may occur in the defective vertical semiconductor device. For example, FIG. 6 illustrates a relationship between a voltage and current applied to the vertical semiconductor device.

The horizontal axis of FIG. 6 represents the time, and illustrates the variation per hour of a voltage and current in the case where a short circuit occurs in an IGBT (Insulated Gate Bipolar Transistor) device during a turn-off operation of the high current switching test.

As illustrated in FIG. 6, when the turn-off operation is started, a voltage ($V_{CE}$) between collector and emitter electrodes instantaneously rises up and a collector current ($I_C$) falls down. However, after the short circuit occurs at the time of occurrence of cracks illustrated in FIG. 6, the voltage ($V_{CE}$) between the collector and emitter electrodes falls down and the collector current ($I_C$) rises up. In other words, FIG. 6 illustrates a state where when the short circuit occurs, a switching operation of the IGBT device is disabled.

Further, in damage within the vertical semiconductor device, a fissure may grow up in a radial pattern from a crack without staying on a portion in which this crack occurs.

As described above, the dynamic characteristic test is not generally performed in a wafer state due to the fact that fissures grow up in a radial pattern in the dynamic characteristic test of the vertical semiconductor device. The reason is that when the dynamic characteristic test is performed in the wafer state, the fissure may grow up to a nondefective vertical semiconductor device adjacent to a defective vertical semiconductor device and therefore, the nondefective vertical semiconductor device receives the damage.

Accordingly, the fact is that a simple body of a semiconductor chip is subjected to the dynamic characteristic test. As a result, there arises the following problem. That is, in the dynamic characteristic test, after the semiconductor substrate is divided into the semiconductor chips by dicing, the individual semiconductor chips are moved up to a prober using a chip handler and a simple body of the semiconductor chip is subjected to the dynamic characteristic test. Therefore, a continuous test fails to be performed on the same stage and therefore, inspection efficiency is reduced.

There is disclosed a method for continuously subjecting a plurality of semiconductor chips to an electrical characteristic test on the same stage without moving the semiconductor chips up to a test apparatus by a chip handler after dividing the semiconductor substrate by dicing (for example, Japanese Laid-open Patent Publication No. 2003-258067).

However, in the above-described known example, a displacement of the semiconductor chips on a support stage, which occurs after the dicing is merely prevented. Accordingly, when cracks that occur in the above-described dynamic characteristic test grow or propagate in a radial pattern, the known example does not prevent the damage from being further expanded. That is, the above-described problem at the time of performing the dynamic characteristic test of the vertical semiconductor device is not yet solved.

SUMMARY

In view of the foregoing, it is an object of the present invention to provide a method for evaluating a semiconductor device for suppressing a fissure growing up or propagating over from a crack occurring in a dynamic characteristic test of a vertical semiconductor device and improving a yield of a semiconductor module. According to one aspect of the present invention, this method includes: fixing a sheet having electrical conductivity to a main surface of a semiconductor substrate on which a plurality of semiconductor devices having a surface structure and a rear surface electrode are arranged; dividing the semiconductor substrate into semiconductor chips on a first support stage in the state where the sheet is fixed to the main surface; and mounting the plurality of divided semiconductor chips on a second support stage via the sheet, and continuously subjecting the plurality of mounted semiconductor chips to a dynamic characteristic test on the second support stage.

The objects and advantages of the invention will be realized and attained by means of the devices and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
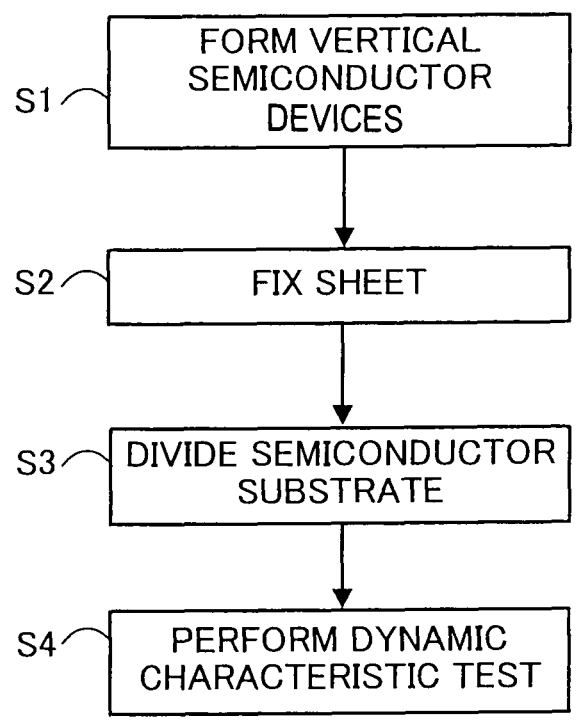
FIG. 1 is a flowchart illustrating a method for evaluating a semiconductor device.

Preferred embodiments of the present invention will now be described in detail below with reference to the accompanying drawings, wherein like reference numerals refer to like elements throughout. At first, a fundamental principle of a method for evaluating a semiconductor device according to the present invention will be described.

FIG. 1 is a flowchart illustrating a semiconductor device evaluation method.

A plurality of vertical semiconductor devices are first fabricated within a semiconductor substrate in a wafer processing (step S1). On surfaces of these vertical semiconductor devices, gate electrodes, each functioning as a control electrode, and emitter (source) electrodes, each functioning as a main electrode, are formed. On rear surfaces of the vertical semiconductor devices, rear surface electrodes, each functioning as a collector (drain) electrode, are formed. For example, an IGBT device or power MOSFET (Metal Oxide Semiconductor Field Effect Transistor) falls under this vertical semiconductor device.

Next, a sheet having electrical conductivity is fixed to rear surface electrodes of all the vertical semiconductor devices formed in the semiconductor substrate (step S2). This processing permits a rear surface of the semiconductor substrate to be protected by the sheet having electrical conductivity.

Next, the semiconductor substrate is divided by dicing with the sheet being fixed to the rear surface of the semiconductor substrate (step S3). This processing permits vertical semiconductor chips to be made into individual pieces from the semiconductor substrate.

A plurality of vertical semiconductor chips that are made into individual pieces from the semiconductor substrate are continuously subjected to a dynamic characteristic test via the sheet on a testing support stage (step S4). For example, a high current switching test falls under the dynamic characteristic test.

Thereafter, the sheet is separated from the rear surface electrode of the semiconductor chip and the semiconductor chip that is determined to be a nondefective chip in the dynamic characteristic test is incorporated into a semiconductor module.

Next, a specific method of the semiconductor device evaluation method will be described based on a flowchart of FIG. 1.

Figure 2A:
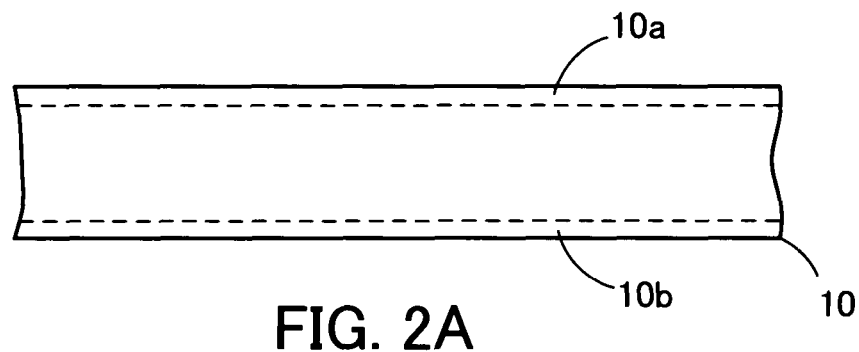
FIGS. 2A to 2C are schematic sectional views illustrating lamination a dicing tape to a semiconductor substrate on which vertical semiconductor devices are formed.
Figure 2B:
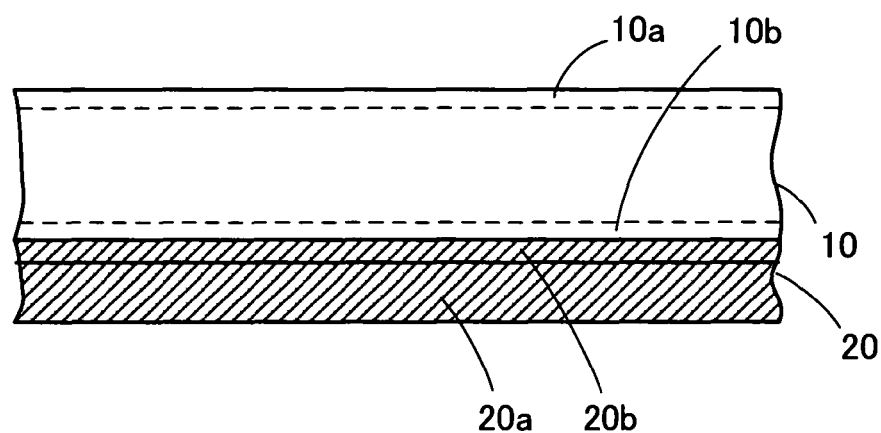
Figure 2C:
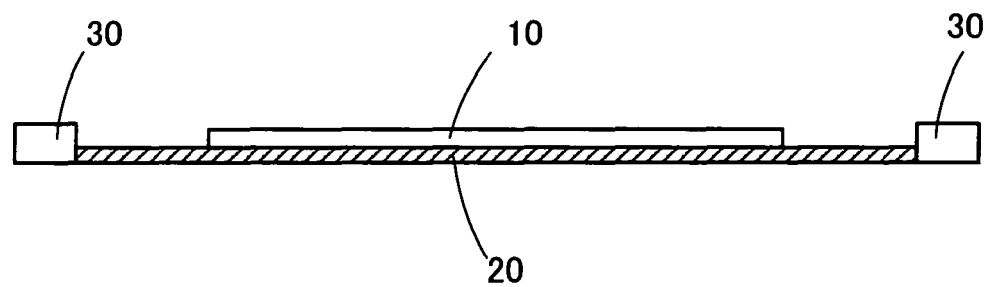

FIGS. 2A and 2B are schematic sectional views illustrating lamination of a dicing tape to the semiconductor substrate having formed therein the vertical semiconductor devices. Here, FIG. 2A illustrates the semiconductor substrate before laminating the dicing tape thereto, and FIGS. 2B and 2C illustrate the semiconductor substrate after laminating the dicing tape thereto.

The semiconductor substrate 10 illustrated in FIG. 2A is a plate-shaped wafer composed mainly of silicon (Si) and, for example, an epitaxial growth substrate or FZ (Floating Zone) substrate falls under the semiconductor substrate 10. A thickness of the semiconductor substrate 10 is, for example, 0.5 mm or less. Further, the semiconductor substrate 10 has a surface structure 10a and a rear surface electrode 10b. Specifically, the semiconductor substrate 10 is subjected to a wafer processing, and on the surface layer of the semiconductor substrate 10, for example, the control electrode (gate electrode) of the vertical semiconductor device, or the emitter electrode (source electrode), as one main electrode of the vertical semiconductor device, is formed. On the other hand, on a rear surface layer of the semiconductor substrate 10, the collector electrode (drain electrode), as another main electrode, is formed. In addition, the rear surface electrode 10b is configured by a metal multilayered film composed of, for example, aluminum (Al), titanium (Ti), nickel (Ni), and gold (Au).

As can be seen from the above discussion, the plurality of vertical semiconductor devices each including the surface structure 10a and the rear surface electrode 10b are arranged longitudinally and laterally on the semiconductor substrate 10. As described above, the IGBT device or power MOSFET falls under the vertical semiconductor device.

Next, as illustrated in FIG. 2B, the dicing tape 20 is laminated on the rear surface side of the semiconductor substrate 10. More specifically, an alignment between the semiconductor substrate 10 in which a wafer processing is completed and the dicing tape 20 having an area larger than that of the semiconductor substrate 10 is performed. The dicing tape 20 is laminated to the rear surface electrodes 10b of the vertical semiconductor devices formed in the semiconductor substrate 10. This processing permits the dicing tape 20 to be fixed to the rear surface electrode 10b of the vertical semiconductor device, and a rear surface of the semiconductor substrate 10 to be protected by the dicing tape 20.

Here, the dicing tape 20 is a sheet having elasticity and adhesion composed of a resin layer 20a being a base member and an adhesive member 20b formed over the resin layer 20a. Further, the resin layer 20a and the adhesive member 20b include a metal powder (not illustrated) such as copper (Cu), gold (Au), and aluminum (Al). An electric resistance of the dicing tape 20 including the above-described metal powder is maintained in the range of the same electric resistance as that of metal such as copper (Cu), gold (Au), and aluminum (Al). In the after-mentioned high current switching test, a high current of approximately 0 to 300 amperes energized in the vertical semiconductor device is stably energized in the thickness direction (vertical direction) and in-plane direction of the dicing tape 20.

As to flexibility of the in-plane direction and adhesion of the surface of the dicing tape 20, it has quality comparable to those of known dicing tape.

Further, the adhesive member 20b of the dicing tape 20 has quality that its adhesion is reduced at a predetermined temperature (e.g., 100 to 150° C.) and separation is easily performed in an interface between the adhesive member 20b and the rear surface electrode 10b.

As illustrated in FIG. 2C, a ring-shaped dicing frame 30 is provided on the end of the dicing tape 20. After fixing the semiconductor substrate 10 to the dicing tape 20, the semiconductor substrate 10, the dicing tape 20, and the dicing frame 30 can be collectively moved by a manual transport or automating transport.

Figure 3A:
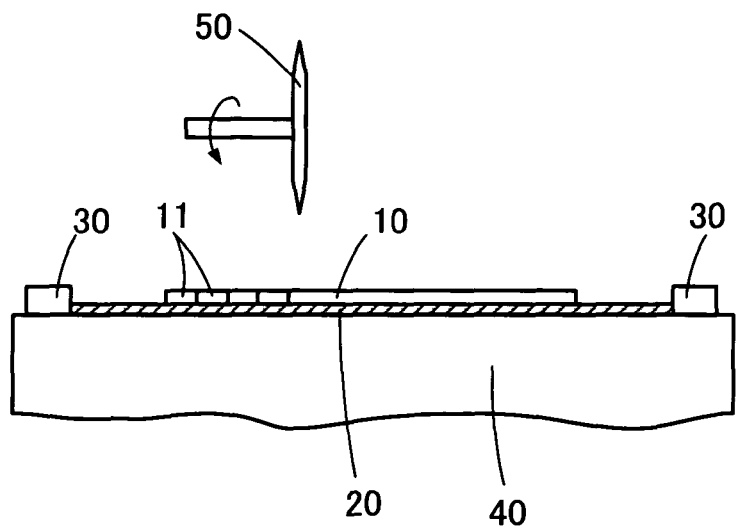
FIGS. 3A and 3B are schematic sectional views illustrating dicing processing.
Figure 3B:
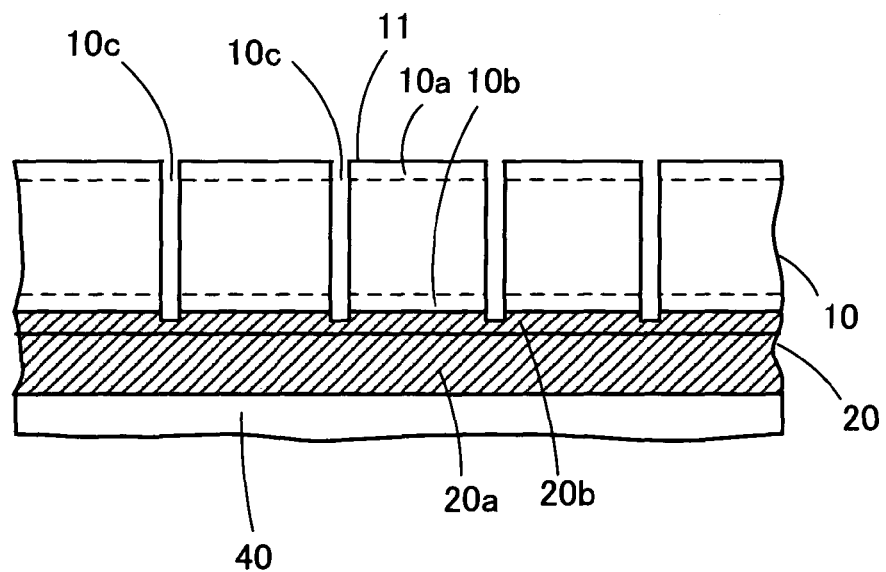

FIGS. 3A and 3B are schematic sectional views illustrating essential parts of a dicing processing. Here, FIG. 3A illustrates the whole view, and FIG. 3B illustrates an enlarged view.

As illustrated in FIG. 3A, the semiconductor substrate 10, the dicing tape 20, and the dicing frame 30 are mounted on a dicing table 40 serving as a dicing support stage, thus fixing the dicing tape 20 and the dicing frame 30. Further, a relative position between a dicing blade 50 and the semiconductor substrate 10 is changed in every direction while rotating the dicing blade 50 at a predetermined rotating speed and bringing the dicing blade 50 into contact with the semiconductor substrate 10. Further, the semiconductor substrate 10 on the dicing tape 20 is divided at a predetermined interval and the vertical semiconductor chips 11 are made into individual pieces from the semiconductor substrate 10.

As illustrated in FIG. 3B, a cut 10c is made in the semiconductor substrate 10 using the dicing blade 50 until perfectly separating the semiconductor substrate 10 into the individual vertical semiconductor chips 11.

In relation to the dicing tape 20, the cut 10c is stopped at a position of the interface between the semiconductor substrate 10 and the dicing tape 20. Or alternatively, as illustrated in FIG. 3B, the cut 10c is stopped at a position where it is slightly penetrated in the thickness direction of the dicing tape 20 from the interface between the semiconductor substrate 10 and the dicing tape 20.

As a result, the dicing tape 20 is prevented from being divided and only the semiconductor substrate 10 on the dicing tape 20 is divided into the individual vertical semiconductor chips 11.

For example, water may be fed to a cut section using a feed-water unit while the semiconductor substrate 10 is divided using the dicing blade 50

Figure 4:
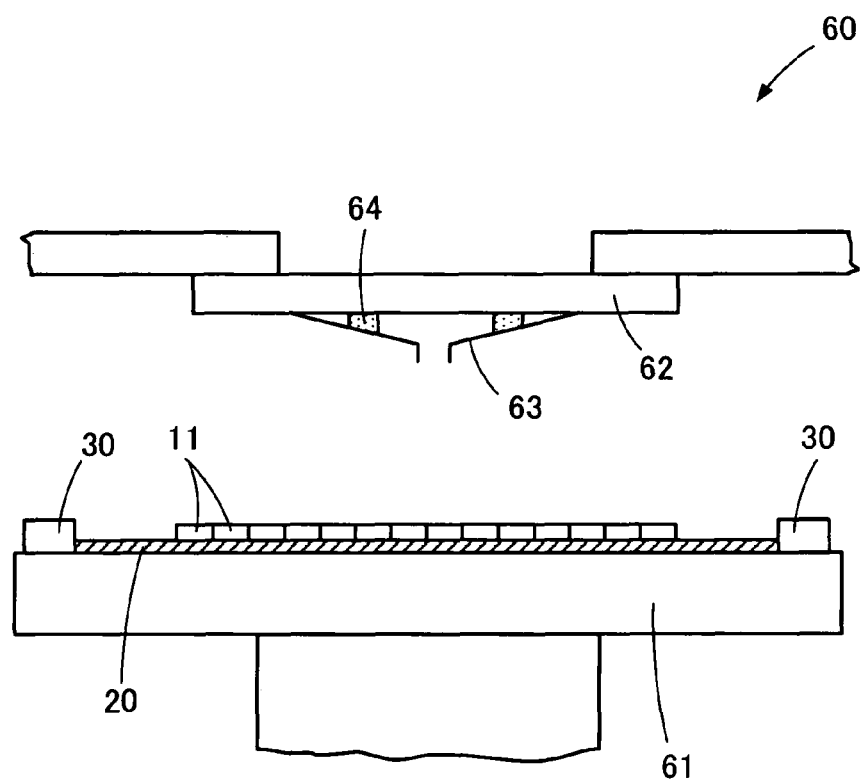
FIG. 4 is a schematic sectional view illustrating a high current switching test processing.
Figure 5:
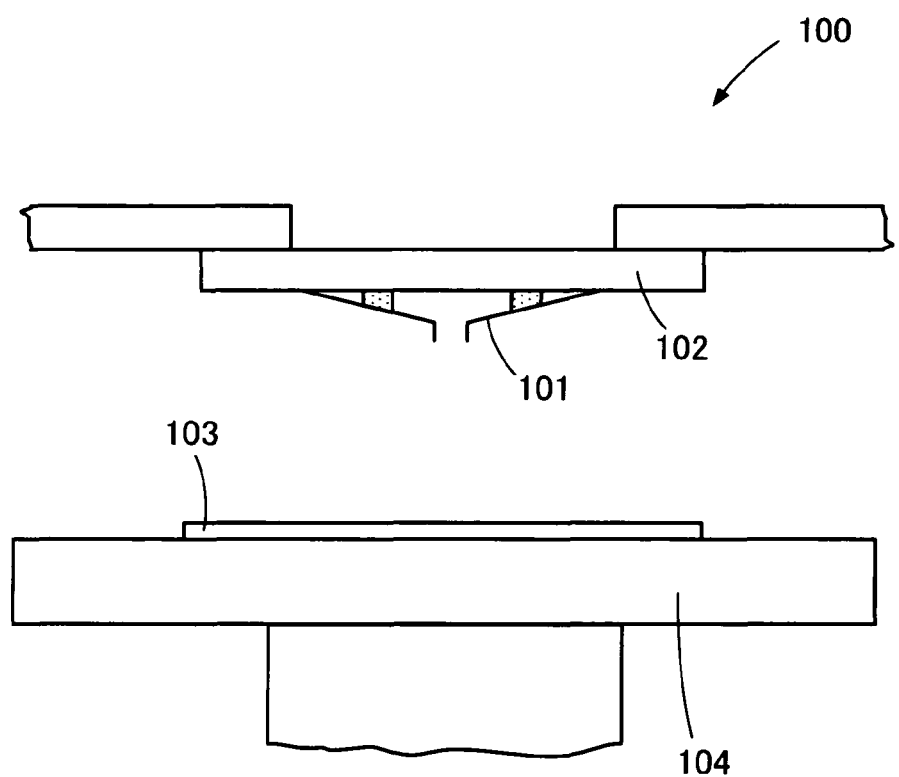
FIG. 5 is a configuration view of an apparatus for performing an electrical characteristic test.
Figure 6:
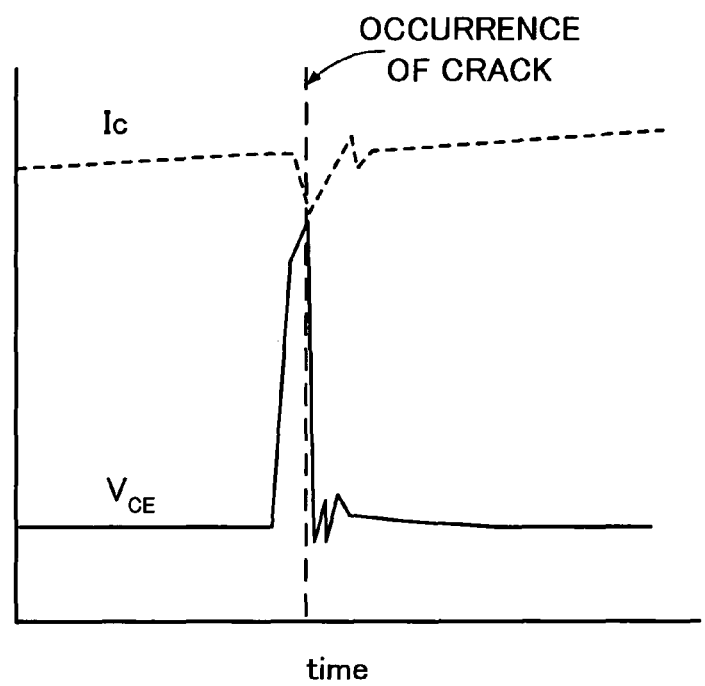
FIG. 6 illustrates a relationship between a voltage and current applied to the vertical semiconductor device.

FIG. 4 is a schematic sectional view illustrating a high current switching test processing.

As illustrated in FIG. 4, a prober (test apparatus) 60 is configured by a prober stage 61 as a testing support stage, a probe card 62, and a plurality of cantilever type probe pins 63 attached onto the probe card 62. Strength of the probe pin 63 is reinforced using a supporting material 64. The plurality of vertical semiconductor chips 11 divided in the previous step, the dicing tape 20, and the dicing frame 30 are mounted on the prober stage 61 and further, the dicing tape 20 and the dicing frame 30 are fixed to the prober stage 61. Under the above-described state, the rear surface electrodes 10b of the individual vertical semiconductor chips 11 and the prober stage 61 are electrically conductive to each other via the dicing tape 20, and the plurality of vertical semiconductor chips are arranged on the same prober stage 61.

Next, the probe pin 63 is brought into contact with the emitter electrode or gate electrode (not illustrated) on the vertical semiconductor chips 11 that are made into individual pieces from the semiconductor substrate, and the individual vertical semiconductor chips 11 are continuously subjected to the high current switching test on the same prober stage 61.

Specifically, any one of the plurality of probe pins 63 is brought into contact with the emitter electrode or gate electrode of at least one of the vertical semiconductor chips 11 arranged on the prober stage 61, and then a voltage is applied between the emitter electrode and the rear surface electrode 10b. Further, when a pulse voltage is applied to the gate electrode, a state of its gate is set to a turn-on state or turn-off state (switching). A high current of approximately 0 to several hundred amperes is energized or disconnected between the emitter electrode and the rear surface electrode 10b. For example, a current up to 500 amperes is energized or disconnected by switching.

Here, as described above, the dicing tape 20 having electrical conductivity is disposed between the rear surface electrode 10b and the prober stage 61. Therefore, an energizing path between the rear surface electrode of the vertical semiconductor chip 11 and the prober stage 61 is secured via the dicing tape 20. Accordingly, the above-described high current switching test can be stably performed on the prober stage 61. Further, after a test for one vertical semiconductor chip is completed, a test for another vertical semiconductor chip adjacent to the semiconductor chip is moved.

By repeating the above-described test, the high current switching tests for all the vertical semiconductor chips on the prober stage 61 are completed. Or alternatively, a plurality of probe pins 63 are collectively brought into contact with a plurality of electrodes of the vertical semiconductor chips 11 and the high current switching test may be performed.

Before performing the high current switching test, the static characteristic test for measuring a leakage current between the gate electrode and the emitter electrode may be performed, if desired.

Next, the high current switching test for each semiconductor chip is completed and then, the dicing tape 20 is transported to, for example, a heating plate or warming device in order to heat the dicing tape 20 to approximately 100 to 150° C. (not illustrated). The above-described processing enables adhesion of the adhesive member 20b of the dicing tape 20 to be weakened and the dicing tape 20 to be simply separated from the rear surface electrode 10b. The vertical semiconductor chip 11 determined to be a defective chip in the above-described testing processing is removed from a manufacturing processing. Further, these defective semiconductor chips are not allowed to move to the next process. On the other hand, the vertical semiconductor chip 11 in which a crack does not occur in a device is allowed to move to the next process and further, incorporated into a semiconductor module by performing the packaging operation.

As can be seen from the above discussion, the proposed semiconductor device evaluation method of the present invention permits the plurality of vertical semiconductor chips to be continuously subjected to the high current switching test on the same prober stage 61 in the state where the plurality of vertical semiconductor chips are fixed to the dicing tape 20. As a result, the inspection efficiency is significantly improved.

Further, according to the proposed semiconductor device evaluation method, the individual divided vertical semiconductor chips 11 are subjected independently to the high current switching test. Therefore, a fissure growing up from a crack that occurs in a defective semiconductor chip is prevented from propagating over other adjacent semiconductor chips. This processing permits the number of the nondefective vertical semiconductor chips 11 per the semiconductor substrate 10 to increase, and the yield and productivity of the semiconductor module to be improved.

According to the present embodiment, one example of the high current switching test is described as the dynamic characteristic test and the dynamic characteristic test is not limited to the high-current switching test. Similarly, the present embodiments can be applied to, for example, a reverse bias safe operating area (RBSOA) test, a turning-off test, an avalanche test, and a load short-circuit test.

According to the above-described embodiments, an example of a current of 500 amperes for performing energization and disconnection is cited, and further, the present embodiments can be applied also to a test for higher current (e.g., 1200 amperes).

In the present invention, the sheet having electrical conductivity is fixed to a main surface of the semiconductor substrate on which the plurality of semiconductor devices having a surface structure and a rear surface electrode are arranged. The semiconductor substrate is divided into the semiconductor chips on a first support stage in the state where the sheet is fixed to its main surface. The plurality of divided semiconductor chips are mounted on a second support stage via the sheet and further, the plurality of mounted semiconductor chips are continuously subjected to the dynamic characteristic test on the second support stage.

As can be seen from the present embodiments, the proposed semiconductor device evaluation methods permit a fissure growing and propagating from a crack occurring in the dynamic characteristic test of the vertical semiconductor device to be suppressed, and the yield and productivity of the semiconductor module to be improved.

All examples and conditional language used herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that various changes, substitutions and alterations could be made hereto without departing from the spirit and scope of the invention.

What is claimed is:

1. A method for evaluating a semiconductor device, comprising:
    fixing a sheet having electrical conductivity to a first surface layer of a semiconductor substrate where a plurality of semiconductor devices is formed, the plurality of semiconductor devices having a surface structure in a second surface layer of the semiconductor substrate and a rear surface electrode in the first surface layer;
    dividing the semiconductor substrate into semiconductor chips on a first support stage in the state where the sheet is fixed to the first surface layer; and
    mounting the plurality of divided semiconductor chips on the sheet on a second support stage, and continuously subjecting the plurality of mounted semiconductor chips to a dynamic characteristic test on the second support stage, wherein a current is able to flow from the second stage and between the rear surface electrode and the sheet.

2. The method according to claim 1, wherein:
   the sheet comprises a resin and an adhesive member including metal powder.

3. The method according to claim 1, wherein:
   the dynamic characteristic test comprises bringing a probe pin into contact with a control electrode or main electrode of at least one of the semiconductor chips that are mounted on the second support stage via the sheet, performing a continuous operation for turning on or off the control electrode, and energizing or disconnecting a current between the main electrode and the rear surface electrode.

4. The method according to claim 1, wherein:
   the current that flows from the second support stage to the semiconductor chips via the sheet is 0 to several thousand amperes.

5. The method according to claim 1, wherein:
   the semiconductor substrate is divided into the semiconductor chips with a dicing blade, and the semiconductor chips are subjected to the dynamic characteristic test by a prober.

6. The method according to claim 1, wherein:
   in dividing the semiconductor substrate into the semiconductor chips, a dicing blade makes a cut only to an interface between the semiconductor substrate and the sheet, or to a position where the dicing blade slightly penetrates the sheet in a thickness direction of the sheet.

* * * * *

UNITED STATES PATENT AND TRADEMARK OFFICE
CERTIFICATE OF CORRECTION

PATENT NO. : 8,471,585 B2
APPLICATION NO. : 12/805273
DATED : June 25, 2013
INVENTOR(S) : Mitsuyoshi Miyazono et al.

It is certified that error appears in the above-identified patent and that said Letters Patent is hereby corrected as shown below:

On the Title Page

Col. 1, Item (73) Assignees:, delete "FUJI ELECTRIC SYSTEMS CO., LTD., Tokyo (JP)" and add -- FUJI ELECTRIC CO., LTD., KAWASAKI (JP) --.

Signed and Sealed this
Twenty-seventh Day of August, 2013

Teresa Stanek Rea
*Acting Director of the United States Patent and Trademark Office*